US 6,593,222 B2

(12) United States Patent
Smoak

(10) Patent No.: US 6,593,222 B2
(45) Date of Patent: Jul. 15, 2003

(54) METHOD TO IMPROVE THE RELIABILITY OF THERMOSONIC GOLD TO ALUMINUM WIRE BONDS

(75) Inventor: Richard C. Smoak, Austin, TX (US)

(73) Assignee: Lattice Corporation, Hillsboro, OR (US)

( * ) Notice: Subject to any disclaimer, the term of this patent is extended or adjusted under 35 U.S.C. 154(b) by 0 days.

(21) Appl. No.: 09/949,112

(22) Filed: Sep. 7, 2001

(65) Prior Publication Data

US 2003/0049923 A1 Mar. 13, 2003

(51) Int. Cl.[7] .................. H01L 21/44; H01L 21/4763
(52) U.S. Cl. .................. 438/615; 438/612; 438/618; 438/686; 438/688
(58) Field of Search .................. 438/612–618, 438/706, 723, 688, 650, 686

(56) References Cited

U.S. PATENT DOCUMENTS

| 4,742,023 A | * | 5/1988 | Hasegawa |
| 5,249,728 A | * | 10/1993 | Lam |
| 5,529,657 A | * | 6/1996 | Ishii |
| 5,904,556 A | * | 5/1999 | Suzuki et al. |
| 6,130,156 A | * | 10/2000 | Havemann et al. |
| 6,306,751 B1 | * | 10/2001 | Patel et al. |

\* cited by examiner

*Primary Examiner*—Ha Tran Nguyen
(74) *Attorney, Agent, or Firm*—Fliesler Dubb Meyer & Lovejoy, LLP

(57) ABSTRACT

A method for manufacturing an integrated circuit improves the reliability of thermosonic bonds formed to attach a gold bond wire to an aluminum interconnect pad by reducing corrosion of the aluminum pad regions. In the method, a gold or silver plating is applied to the aluminum bond pads to prevent corrosion of the aluminum pad surface. Prior to applying the plating, corrosive contaminants are removed from the aluminum pad regions using an argon sputter etch. Annealing is used to remove damage from the argon sputtering, and further serves to alloy the resultant aluminum to gold or aluminum to silver interface. The aluminum pad layer is made very thin, or less than approximately 8000 Å to limit Kirkendall voiding when gold wires are bonded to the pad using a thermosonic bonding process.

17 Claims, 3 Drawing Sheets

METHOD TO IMPROVE THE RELIABILITY OF THERMOSONIC GOLD TO ALUMINUM WIRE BONDS

BACKGROUND OF THE INVENTION

1. Field of the Invention

The present invention relates generally to the manufacturing process of semiconductor devices, and more particularly to forming aluminum bond pad regions to avoid corrosion.

2. Background

Microelectronic circuit manufacturers typically manufacture integrated circuits with interconnect bond pad regions exposed in openings of a top passivation layer. The metal pad provides a region for interconnection of components in the integrated circuit to external components. A bonding wire is soldered or otherwise attached to the pad to enable connection to the external circuitry. Vias connect the pad internally to a lower metalization region which forms an interconnect line to connect to components in the integrated circuit.

Corrosion of aluminum pad regions can occur both during manufacturing, and afterward because the aluminum pads are exposed in non-hermetically sealed plastic packages. Corrosion can occur during manufacturing because of fluorine used in passivation etching to expose the pad regions. The fluorine etchant is typically applied to remove unmasked portions of the top silicon layer of a chip to expose the pad regions. The passivation etch typically contains sulfur hexa-fluoride ($SF_6$). The fluorine and sulfur in $SF_6$ causes corrosion of the aluminum pads.

The pad regions of the integrated circuit are not typically hermetically sealed to prevent corrosion. Instead, the pads are left exposed to enable bond wires to be attached. Exposure of the aluminum pad to fluorine during the manufacturing process results in corrosion of the aluminum pad. Other environmental contaminants can also cause undesirable corrosion to the exposed aluminum pads after manufacturing is complete.

Thermosonic ball-bonding is used to attach an interconnect wire or ribbon to the metal bond pad when the integrated circuit contains heat sensitive components. Thermosonic bonding uses a combination of a relatively low temperature, pressure, and a high frequency to bond the ribbon or wire conductor to the metal interconnect pad which provides connectivity to the sensitive circuitry. Relatively low temperature indicates a temperature no greater than the temperature that would potentially cause a modification of the circuit parameters of at least one of the system components. Such a temperature may range up to 150 degrees Celsius, significantly lower than typical soldering temperatures. A substrate is typically heated by the way of a heating plate upon which the integrated substrate is clamped, and pressure is further applied to the substrate.

The temperature is applied while the ultrasonic bonding frequency ranging from 60 KHz up to 140 KHz is applied to the wire bonding lead. The combination of the application of high temperature, pressure, and the moderate ultrasonic frequency abrasion operates to effect metallurgical atomic diffusion bonding of the wire bond with the metal pad bonding site. The high frequency range achieves the requisite atomic diffusion bonding energy, without causing fracturing or destruction of the bonding wire or its interface with the metal bond pad.

It is desirable to improve the reliability of the thermosonic gold to aluminum wire bonds. To provide such reliability, it is desirable to provide a pad structure for an integrated circuit which minimizes corrosion during manufacture and afterward when the integrated circuit is provided in a non-hermetically sealed plastic package.

SUMMARY OF THE INVENTION

In accordance with the present invention a method is provided to improve the reliability of gold to aluminum thermosonic bonds by plating the aluminum bond pads to prevent corrosion.

To prevent corrosion, the aluminum bond pads are sealed with gold or silver plating. The gold or silver plating serves to eliminate corrosion due to exposure of the aluminum to fluorine during the manufacturing process. The plating further prevents corrosion of the aluminum pads in the non-hermetically sealed plastic packages after manufacture.

To reduce corrosion prior to plating the aluminum pad, an argon sputter is applied to remove corrosive contaminants remaining from the passivation etch. The argon sputter etch is limited to remove only approximately 100 angstroms of aluminum from the pad regions. Next the 100–200 Å layer of gold or silver plating is deposited on the aluminum pad. An alloy step may then be used to anneal damage from the argon sputter process and alloy the resultant aluminum to gold or aluminum to silver interface.

In a further embodiment, the aluminum pad layer is made very thin, or less than approximately 8000 Å, to limit Kirkendall voiding caused by gold (Au) atoms from gold wire thermosonic bonds diffusing into the aluminum pad layer.

BRIEF DESCRIPTION OF THE DRAWINGS

The present invention will be described with respect to particular embodiments thereof, and references will be made to the drawings in which.

DETAILED DESCRIPTION

Figure 1:
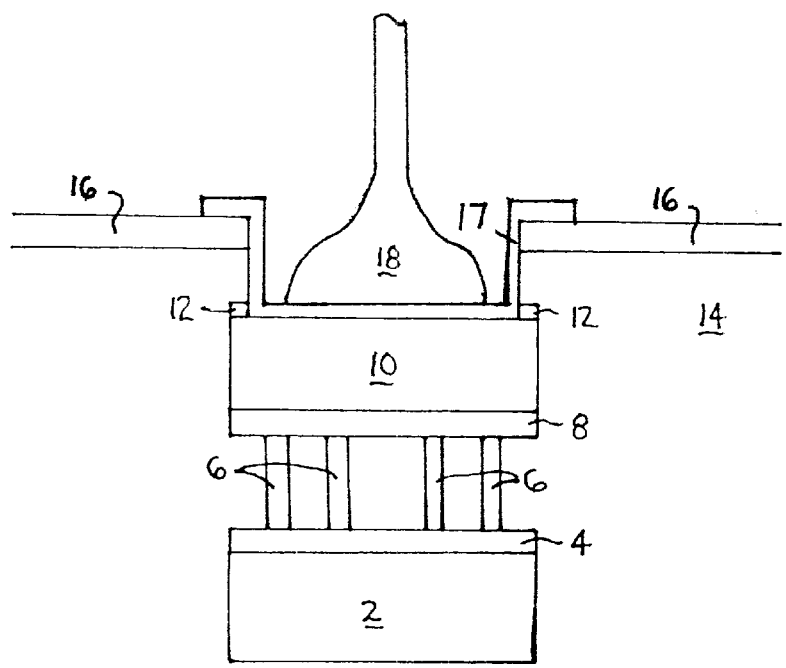
FIG. 1 shows a cross-section of a semiconductor device in accordance with the present invention with a thermosonic ball bonded wire bond.

FIG. 1 shows the cross-section of a semiconductor device in accordance with the present invention with an interconnect pad 10 and wire bond 18. The pad 10 is formed using a deposited aluminum region. A wire 18, which is preferably gold, is bonded to the aluminum pad 10 using a thermosonic bonding process. The pad 10 is connected by tungsten filled vias 6 to an aluminum interconnect line 2 to provide signal connections to semiconductor components (not shown) formed in the semiconductor substrate.

To fabricate the integrated circuit, an aluminum metalization region is deposited on a silicon substrate and etched to form an interconnect line region 2 which connects to integrated circuit components (not shown) in the substrate.

The interconnect line 2 may be several material layers above the base of the integrated circuit substrate, with underlying layers used to form the internal integrated circuit components which are not shown.

A thin layer of titanium nitride (TiN) 4 is deposited using a titanium arc ion plating process onto the aluminum line region 2. With the interconnect line region 2 being aluminum, the TiN coating 4 is used to avoid the formation of an insulating film resulting from reactions between fluorine and aluminum, the presence of fluorine being due to the fact that tungsten depositions (vias 6 discussed subsequently) are formed with tungsten fluorides.

As an alternative to the TiN coating 4 applied to the aluminum line region 2 alone, a thin titanium layer can be deposited over the TiN layer. The thin titanium layer enhances the wettability along via walls 6 in which the tungsten is later deposited, essentially forming a glue layer or adhesion enhancer.

A portion of the passivation layer 14 made of $SiO_2$ is typically grown over the TiN layer 4, or Ti/TiN layer 4 up to the bottom of a metalization layer 8, the metalization layer 8 being discussed subsequently. This portion of the $SiO_2$ insulates one or more metalization or other layers (not shown) which provide connections to components in the integrated circuit above the metalization layer 2. Vias 6 are then formed in this portion of the passivation layer 14 by first applying a photoresist mask with openings where the vias 6 are to be formed, and then applying a passivation etch to remove the passivation layer 14 where the photoresist mask does not cover. The vias 6 are then filled with tungsten to provide an electrical connection to the aluminum interconnect line 2. A number of vias 6 are used to decrease electrical resistance and reduce parasitic capacitance.

A thin titanium layer 8 is next deposited to cover the tungsten filled vias 6. In one embodiment, the titanium layer thickness ranges from 150–250 Å. The thin titanium layer 8 improves the mechanical adhesion of the aluminum film 10 applied above the titanium layer 8 in a subsequent step to the underlying layers of $SiO_2$ and tungsten.

In the alternative embodiment, the titanium nitride layer is placed just below the thin titanium layer 8 to better prevent the formation of an insulating film resulting from reactions between fluorine and the later deposited aluminum layer 10, the presence of fluorine being due to the fact that the tungsten vias are formed using tungsten fluorides.

Next a thin aluminum layer 10 is deposited on the titanium 8 to form the bonding pad. In one embodiment, the aluminum pad 10 is copper doped to approximately 0.5%. Further, the aluminum pad 10 in one embodiment is preferably made relatively thin to approximately 8000 Å to reduce the available aluminum for diffusion at the gold aluminum interface when a gold bonding wire 18 is attached. Diffusion of gold (Au) atoms from the gold bond wire 18 into the aluminum 10 causes Kirkendall voiding in the gold wire, a condition which the thin aluminum layer helps prevent.

Figure 2:
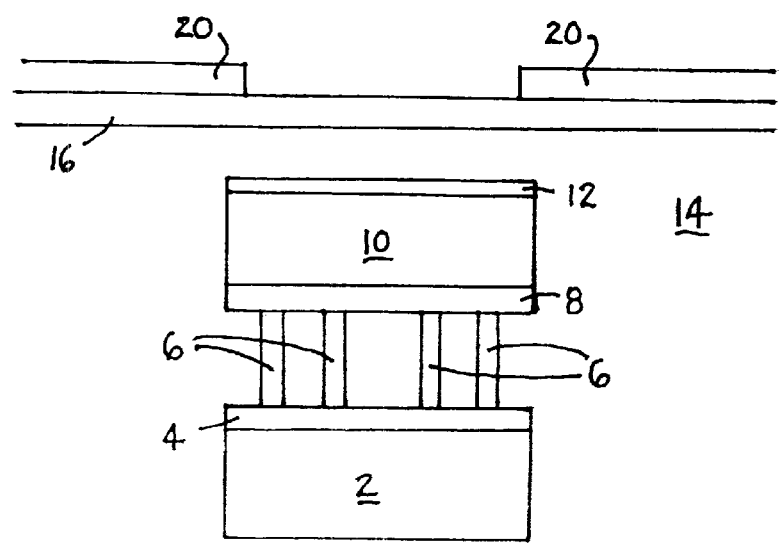
FIG. 2 shows a cross-section of the semiconductor device of FIG. 1 during manufacture before etching a passivation layer above the aluminum pad.
Figure 3:
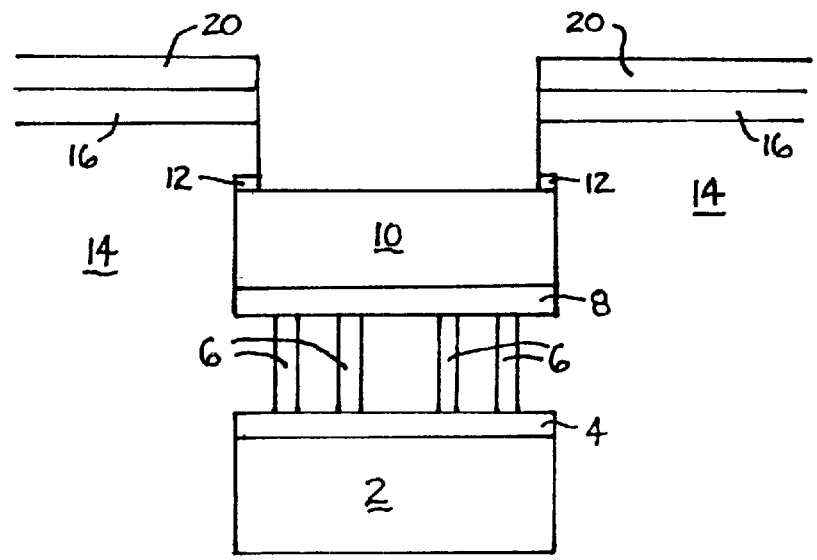
FIG. 3 illustrates the semiconductor device of FIG. 3 following a passivation etch step.

FIG. 2 shows the circuit of FIG. 1 during manufacturing before a passivation etch is applied to layers above the aluminum pad 10. As shown in FIG. 3, before processing, the $SiO_2$ passivation layer 14 is grown over the entire integrated circuit. A $Si_3N_4$ layer 16 may then in one embodiment be deposited over the $SiO_2$ layer as part of the passivation layer. The $Si_3N_4$ provides a hard crystalline layer to protect the $SiO_2$.

As further shown in FIG. 2, in one embodiment, a TiN layer is deposited on the aluminum 10 using a titanium arc ion plating process. The titanium 12 prevents corrosion of the aluminum due to fluoride in etching compounds used during subsequent manufacturing steps.

As further shown in FIG. 2, during manufacture, a photoresist mask 20 is formed and patterned as illustrated in FIG. 2 to form an opening over the aluminum pad region 10. Note, components carried over from FIG. 1 to FIG. 2 are similarly labeled, as will be components carried over in subsequent drawings.

FIG. 3 illustrates the semiconductor device of FIG. 2 following a passivation etch step before removal of the photoresist mask 20. As illustrated, during the passivation etch step, the intent is to remove the portion of the passivation layer, including $SiO_2$ layer 14, $Si_3N_4$ layer 16 and TiN layer 12, under the mask opening overlying a portion of the aluminum pad 10. The etch step, in one embodiment, is timed to stop once the passivation layer is calculated to have been removed to expose a region of the aluminum pad 10 underling the mask opening.

In accordance with the present invention, a reactive ion etch (RIE) passivation etch can be used which does not include sulfur hexa-fluoride. Instead, the RIE includes argon as the carrier gas, $CF_4$ and $CHF_3$ as active etchants and $O_2$ to reduce the residual halide contaminant in the aluminum pad 10 following the passivation mask.

Figure 4:
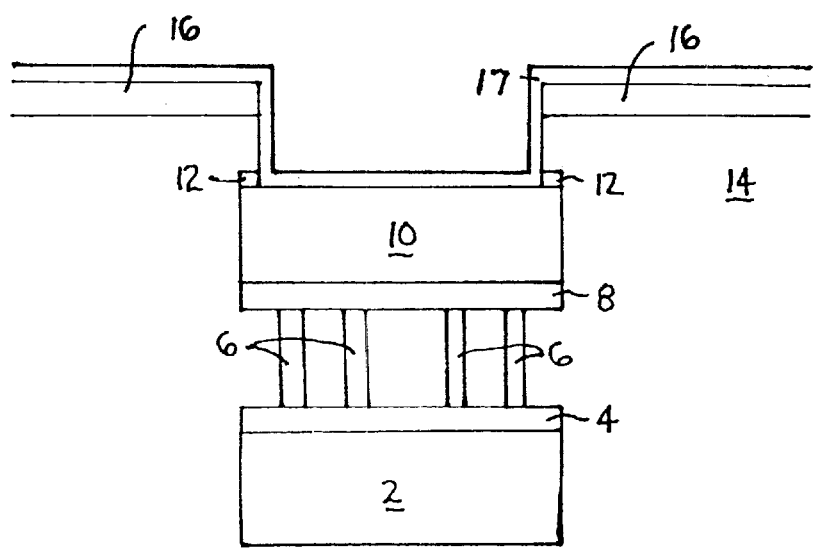
FIG. 4 shows the semiconductor device of FIG. 3 after a layer of plating to cover the aluminum pad is added.

FIG. 4 shows the semiconductor device of FIG. 3 after a layer of plating 17 to cover the aluminum pad 10 is added. The plating 17 is a thin 100–200 Å layer of gold or silver deposited on the aluminum pad 10 to seal the pad to prevent corrosion. The gold or silver plating serves to eliminate corrosion due to exposure of the aluminum to fluorine during the manufacturing process. The plating further prevents corrosion of the aluminum pads in the non-hermetically sealed plastic packages after manufacture.

Prior to depositing the plating 17, in one embodiment an argon sputter is applied to remove corrosive contaminants remaining from the passivation etch. The argon sputter etch is limited to remove approximately 100 angstroms of aluminum from the pad regions. The layer of gold or silver plating 17 is deposited on the aluminum pad after the argon sputter etchant is applied. An alloy step may then be used to anneal damage from the argon sputter process and alloy the resultant aluminum to gold or aluminum to silver interface.

Figure 5:
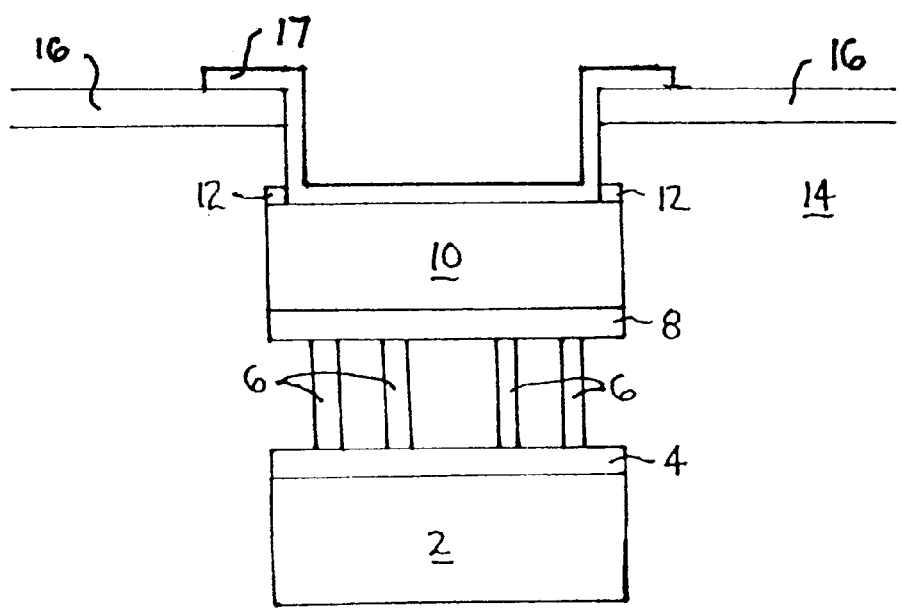
FIG. 5 shows the semiconductor device of FIG. 4 with a portion of the plating removed following an etch step.

Additional processing steps are included in the manufacturing process to remove the plating 17 from areas other than the aluminum pad 10. FIG. 5 shows the semiconductor device of FIG. 4 with a portion of the plating 17 etched away after a photoresist material is applied to cover regions over the aluminum pad to assure plating remains substantially only over the pads after etching.

The process for forming an integrated circuit described in this application is available for very small opening regions above the pad, such as below 60 microns. Further, because components in a typical circuit using a 60 micron or smaller pad opening are small and heat sensitive, thermosonic ball-bonding of a gold wire or ribbon 18 to the plated aluminum pad 10 is preferably used.

As described previously, thermosonic bonding uses a combination of a relatively low temperature, pressure, and a high frequency to bond the ribbon or wire conductor to the metal interconnect pad which provides connectivity to the sensitive circuitry. Relatively low temperature indicates a temperature no greater than the temperature that would potentially cause a modification of the circuit parameters of at least one of the system components. Such a minimum temperature may range up to 150 degrees Celsius. The substrate will be heated by the way of a heating plate upon which the integrated substrate is clamped, and pressure is further applied to the substrate. The temperature is applied while the ultrasonic bonding frequency ranging from 60 KHz up to 140 KHz is applied to the clamped structure by means of the wire bonding lead. The combination of the application of high temperature, pressure, and the moderate ultrasonic frequency abrasion is operative to effect metallurgical atomic diffusion bonding of the bond wire with the metal pad bonding site, without causing fracturing or destruction of the gold bonding wire or its interface with the metal bond pad.

Although the present invention has been described above with particularity, this was merely to teach one of ordinary skill in the art how to make and use the invention. Many other modifications will fall within the scope of the invention, as that scope is defined by the claims provided below.

What is claimed is:

1. A method for forming a bonding pad in an integrated circuit comprising the steps of:

forming aluminum pad regions in the integrated circuit;

forming a passivation layer covering the aluminum pad regions;

forming a first mask over the passivation layer with openings disposed over the aluminum pad regions;

etching the passivation layer to form openings over the aluminum pad regions in the passivation layer;

depositing a gold plating layer over the passivation layer and the aluminum pad regions;

forming a second mask over the gold plating layer with regions of the second mask disposed over areas other than the aluminum pad regions; and etching the gold plating layer to leave the gold plating covering the aluminum pad regions, wherein after the step of etching the gold plating layer to leave the gold plating layer covering the aluminum pad regions, the following step is performed:

annealing to form an alloy interface between the gold plating layer and the aluminum pad regions.

2. The method of claim 1, wherein the gold plating layer has a thickness of 100–200 Å.

3. The method of claim 2, wherein after the step of etching the passivation layer to form openings over the aluminum pad regions, the following step is performed:

applying an argon sputter etch.

4. The method of claim 3, wherein the argon sputter etch removes approximately 100 Å of the aluminum pad regions.

5. The method of claim 3, wherein the aluminum pad regions each have a thickness less than approximately 8000 Å.

6. The method of claim 5, wherein in the step of etching the passivation layer to form openings over the aluminum pad regions, the etchant comprises an argon carrier gas, $CF_4$ and $CHF_3$ active etchants and $O_2$ to reduce residual halide contaminant.

7. A method of forming levels of an interconnect structure for an integrated circuit comprising the steps of:

forming a first aluminum interconnect layer;

depositing a first titanium containing layer on the first aluminum interconnect layer;

covering the first titanium containing layer with a first insulating layer;

etching openings in the first insulating layer;

depositing tungsten in the openings in the first insulating layer to form vias;

depositing a second titanium containing layer on the first insulating layer;

forming an aluminum pad region on the second titanium containing layer;

forming a passivation layer covering the aluminum pad region and surrounding the aluminum pad region;

forming a first mask over the passivation layer with an opening disposed over the aluminum pad region;

applying a passive etchant to remove a portion of the passivation layer and form an opening over the aluminum pad region;

depositing a gold plating layer over the passivation layer and the aluminum pad region;

applying an argon sputter etch to the gold plating layer;

forming a second mask over the gold plating layer with region of the second mask disposed over an area other than the aluminum pad region; and etching the gold plating layer to leave the gold plating layer covering the aluminum pad region, wherein after the step of etching the gold plating layer to leave the gold plating layer covering the aluminum pad region, the following step is performed:

annealing to form an alloy interface between the gold plating and the aluminum pad region.

8. The method of claim 7, wherein the aluminum pad region has a thickness less than approximately 8000 Å.

9. The method of claim 8, wherein the metal gold plating layer has a thickness of 100–200 Å.

10. The method of claim 7, wherein the passivation layer comprises:

a layer of $SiO_2$ deposited on the second titanium containing layer; and a layer of $Si_3N_4$ deposited on the $SiO_2$ layer.

11. The method of claim 7, wherein the first titanium containing layer comprises:

a layer of titanium nitride covered by a layer of titanium, all deposited over the first aluminum interconnect layer.

12. The method of claim 7, wherein the second titanium containing layer comprises:

a layer of titanium covered by a layer of titanium nitride, all deposited beneath the aluminum pad region.

13. The method of claim 7, further comprising the step of bonding a gold wire to the aluminum pad region.

14. The method of claim 13, wherein the step of bonding the gold wire comprises the steps of:

heating the interconnect structure to a prescribed temperature; and bringing a gold wire connector into contact with the aluminum pad region, and ultrasonically vibrating the gold wire to affect a thermosonic bond of the gold wire to the aluminum pad region.

15. The method of claim 7, wherein the step of etching the passivation layer to form openings over the aluminum pad region, the etchant comprises an argon carrier gas, $CF_4$ and $CHF_3$ active etchants and $O_2$ to reduce residual halide contaminant.

16. A method for forming a bonding pad in an integrated circuit, comprising:

forming an aluminum pad region in the integrated circuit;

applying a sputter etch to the aluminum pad region; and depositing a plating layer of gold or silver over the etched aluminum pad region, wherein the gold or silver plating layer has a thickness of 100–200 Å, wherein the argon sputter etch removes approximately 100 Å of the aluminum pad region, and wherein annealing is performed to form an alloy interface between the gold or silver plating layer and the aluminum pad region.

17. The method of claim 16, wherein the aluminum pad region has a thickness less than approximately 8000 Å.

* * * * *